United States Patent
Yamamoto et al.

(10) Patent No.: US 9,905,747 B2
(45) Date of Patent: Feb. 27, 2018

(54) CRYSTAL VIBRATION DEVICE

(71) Applicant: Murata Manufacturing Co., Ltd., Nagaokakyo-shi, Kyoto-fu (JP)

(72) Inventors: Hiroyuki Yamamoto, Nagaokakyo (JP); Masaru Asai, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 385 days.

(21) Appl. No.: 14/871,805

(22) Filed: Sep. 30, 2015

(65) Prior Publication Data

US 2016/0027990 A1    Jan. 28, 2016

Related U.S. Application Data

(63) Continuation of application No. PCT/JP2014/057802, filed on Mar. 20, 2014.

(30) Foreign Application Priority Data

Apr. 8, 2013   (JP) ................................. 2013-080301

(51) Int. Cl.

| | |
|---|---|
| *H01L 41/053* | (2006.01) |
| *H03H 9/19* | (2006.01) |
| *H03H 9/02* | (2006.01) |
| *H03H 9/05* | (2006.01) |
| *H03H 9/10* | (2006.01) |
| *H01L 41/047* | (2006.01) |

(52) U.S. Cl.
CPC ........ *H01L 41/053* (2013.01); *H01L 41/0472* (2013.01); *H03H 9/02157* (2013.01); *H03H 9/0509* (2013.01); *H03H 9/1021* (2013.01); *H03H 9/19* (2013.01)

(58) Field of Classification Search
CPC .............. H01L 41/053; H01L 41/0472; H03H 9/02157; H03H 9/0509; H03H 9/1021; H03H 9/19
USPC ................................ 310/340, 344, 348, 349
See application file for complete search history.

(56) References Cited

FOREIGN PATENT DOCUMENTS

| JP | 2001-77651 A | 3/2001 | |
|---|---|---|---|
| JP | 2007-53820 A | 3/2007 | |
| JP | 2009-267888 A | 11/2009 | |
| JP | 2010-62723 A | 3/2010 | |
| JP | 2010062723 A | * 3/2010 | ............... H03H 9/19 |
| JP | 2011-182155 A | 9/2011 | |
| JP | 2012-249099 A | 12/2012 | |

* cited by examiner

*Primary Examiner* — Thomas Dougherty
(74) *Attorney, Agent, or Firm* — Arent Fox LLP

(57) ABSTRACT

A crystal vibration device where a crystal unit is supported on a case substrate in a cantilever manner by first and second conductive adhesive layers. The crystal unit has a length direction and is formed using a rectangular-plate-shaped crystal substrate and $A > 4.30t + 0.16$, where A (mm) represents a shorter distance among distances between a central axis of the crystal substrate and end portions of the first and second conductive adhesive layers on a central axis side, and t (μm) represents a thickness of the crystal substrate.

7 Claims, 4 Drawing Sheets

CRYSTAL VIBRATION DEVICE

CROSS REFERENCE TO RELATED APPLICATIONS

The present application is a continuation of International application No. PCT/JP2014/057802, filed Mar. 20, 2014, which claims priority to Japanese Patent Application No. 2013-080301, filed Apr. 8, 2013, the entire contents of each of which are incorporated herein by reference.

FIELD OF THE INVENTION

The present invention relates to crystal vibration devices employing a crystal unit and particularly relates to crystal vibration devices in which a crystal unit is mounted on a case substrate using a conductive adhesive.

BACKGROUND OF THE INVENTION

Conventionally, crystal vibration devices employing a crystal unit are widely used in resonators and so forth. For example, a piezoelectric device in which a crystal unit is supported in a cantilever manner on a base substrate is disclosed in below-listed Patent Document 1. The crystal unit is formed using an AT cut crystal vibration element in which a thickness shear vibration is a main vibration. In addition, the crystal unit is fixed to the base substrate using a support mount. The support mount is composed of an epoxy resin or a silicone resin for example.

On the other hand, a piezoelectric device employing a crystal unit is disclosed in below-listed Patent Document 2. In this piezoelectric device, the crystal unit is sealed inside a substrate, a seal ring, a lid composed of a metal and a package. The crystal unit is supported in a cantilever manner on the substrate. The crystal unit is bonded to the substrate using a conductive adhesive. In Patent Document 2, it is described that a dimension of the conductive adhesive in a width direction of the crystal unit is given a specific range.

Patent Document 1: Japanese Unexamined Patent Application Publication No. 2011-182155
Patent Document 2: Japanese Unexamined Patent Application Publication No. 2001-77651

SUMMARY OF THE INVENTION

It is described that the support mount of the piezoelectric device described in Patent Document 1 is formed of an epoxy resin or a silicone resin. However, an equivalent series resistance (ESR) characteristic may be degraded depending on the position of the support mount. That is, ESR may become higher.

On the other hand, in Patent Document 2, although description is given regarding the dimension of the conductive adhesive in the width direction of the crystal unit, no description is given regarding a dimension in a long-edge direction of the crystal unit. In the piezoelectric device described in Patent Document 2, there is a risk that the vibration will be damped depending on the coating state of the conductive adhesive bonding the crystal unit. In other words, excellent vibration characteristics cannot be obtained with certainty.

An object of the present invention is to provide a crystal vibration device in which degradation of an ESR characteristic is unlikely to occur.

A crystal vibration device according to the present invention includes a case substrate, first and second mounting electrodes, a crystal unit and first and second conductive adhesive layers. The first and second mounting electrodes are formed on an upper surface of the case substrate. The crystal unit is mounted on the case substrate and has a length direction and a width direction orthogonal to the length direction. The crystal unit is formed using an AT cut rectangular-plate-shaped crystal substrate. The first and second conductive adhesive layers electrically connect the crystal unit to the first and second mounting electrodes and support the crystal unit at one end of the crystal unit in the length direction in a cantilever manner.

In the present invention, when A (mm) represents a shorter distance among a distance between a central axis of the crystal substrate orthogonal to the length direction and extending in the width direction and an end portion of the first conductive adhesive layer on a central axis side and a distance between the central axis of the crystal substrate orthogonal to the length direction and extending in the width direction and an end portion of the second conductive adhesive layer on the central axis side and t (μm) represents a thickness of the crystal substrate, A>a range of 4.30t+0.16.

In a certain specific aspect of the crystal vibration device according to the present invention, the length direction of the crystal substrate is an X axis direction of a crystal.

When the X axis direction is the length direction, the crystal unit is supported at a short-edge side thereof in a cantilever manner. In this case, there is a risk that the effect of vibration restriction due to the support structure will be large, but degradation of the ESR characteristic can be effectively suppressed by the form of the present invention.

In another specific aspect of the crystal vibration device according to the present invention, the first and second conductive adhesive layers are composed of an epoxy-resin-based adhesive including an epoxy resin and a conductive material dispersed in the epoxy resin. In this case, the crystal unit can be mechanically supported more firmly.

In yet another specific aspect of the crystal unit according to the present invention, the crystal unit includes a first excitation electrode provided on an upper surface of the crystal substrate, a second excitation electrode provided on a lower surface of the crystal substrate and superposed with the first excitation electrode, and first and second terminal electrodes electrically connected to the first and second excitation electrodes and provided on the lower surface of the crystal substrate.

With the crystal vibration device according to the present invention, since the distance A is given a specific range, degradation of the ESR characteristic can be effectively suppressed. Therefore, a crystal vibration device having excellent characteristics can be provided.

DETAILED DESCRIPTION OF THE PREFERRED EMBODIMENTS

Figure 1:
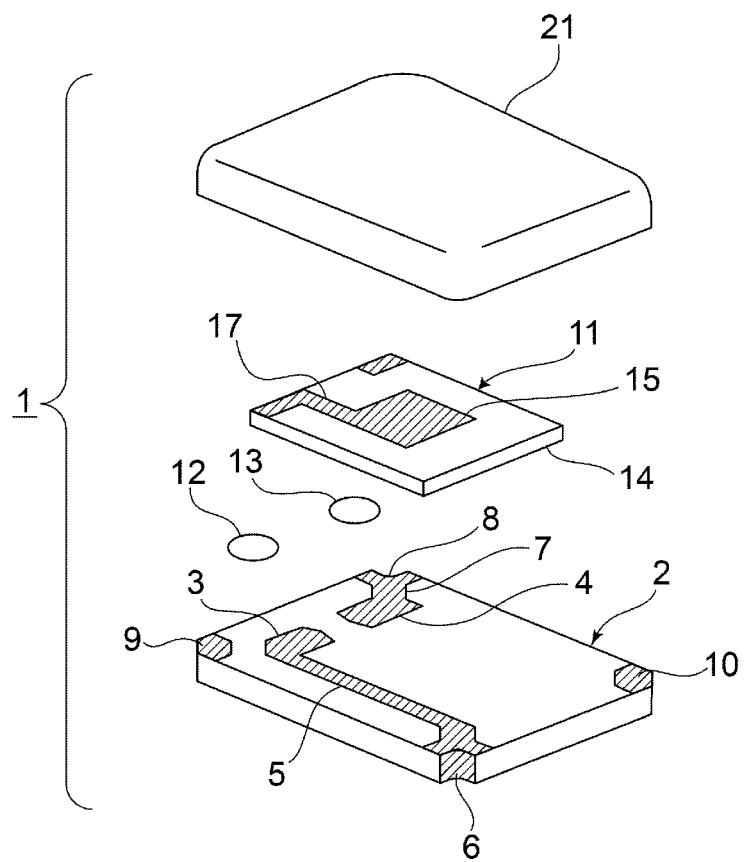
FIG. 1 is an exploded perspective view of a crystal vibration device according to an embodiment of the present invention.

Hereafter, the present invention will be made clearer by describing specific embodiments of the present invention while referring to the drawings.

FIG. 1 is an exploded perspective view of a crystal vibration device according to an embodiment of the present invention. A crystal vibration device 1 includes a case substrate 2. The case substrate 2 is composed of a suitable insulating material. As examples of such an insulating material, an insulating ceramic such as alumina and a synthetic resin can be given. In this embodiment, the case substrate 2 is composed of alumina.

First and second mounting electrodes 3 and 4 are formed on an upper surface of the case substrate 2. The first mounting electrode 3 is led out to one corner portion of the case substrate 2 by a wiring electrode 5. A first outer electrode 6 is formed in part of that corner portion. The first outer electrode 6 is attached to an inner peripheral surface of a concavity provided by cutting away part of the corner portion.

On the other hand, the second mounting electrode 4 is electrically connected to a second outer electrode 8 via a wiring electrode 7. The second outer electrode 8 is provided in a corner portion at a position diagonally opposite the corner portion where the first outer electrode 6 is formed.

Dummy electrodes 9 and 10, which are connected to the ground potential, are formed at the remaining two corner portions.

The first and second mounting electrodes 3 and 4, the wiring electrodes 5 and 7, the first and second outer electrodes 6 and 8 and the dummy electrodes 9 and 10 are formed of a suitable metal or alloy such as Al or Cu for example.

A crystal unit 11 is bonded to the top of the case substrate 2 using first and second conductive adhesive layers 12 and 13.

Figure 2A:
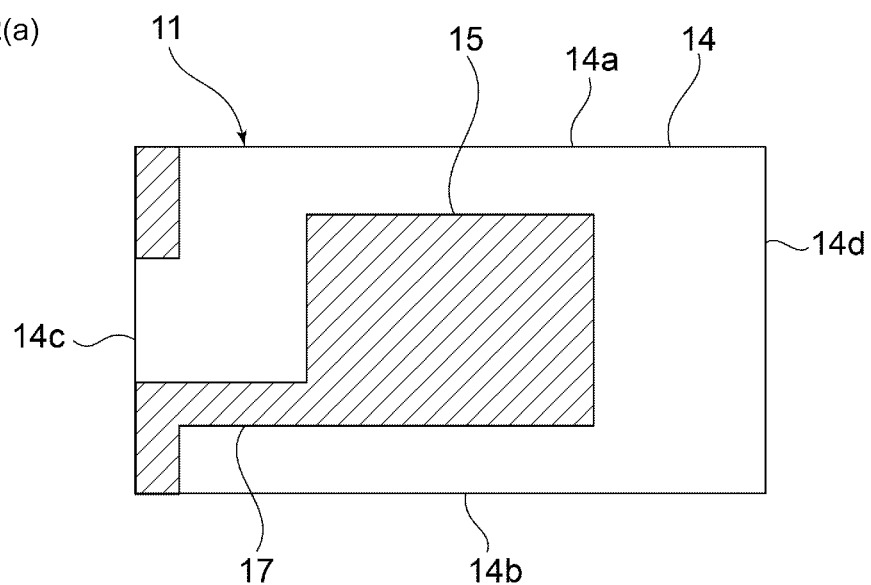
FIG. 2(a) is a plan view of a crystal unit used in the crystal vibration device of the embodiment of the present invention and FIG. 2(b) is a schematic plan view illustrating the electrode structure of a lower surface.
Figure 2B:
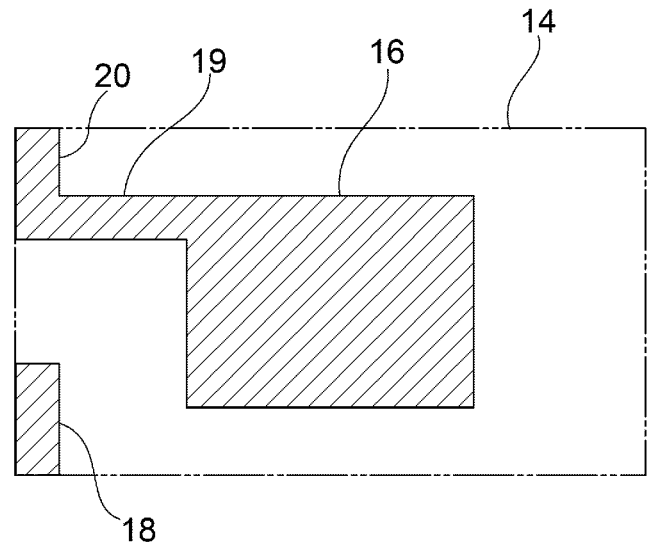

As illustrated in FIGS. 2(a) and 2(b), the crystal unit 11 includes an AT cut crystal substrate 14. The AT cut crystal substrate 14 has a rectangular-plate-like shape having a length direction. In this embodiment, the length direction is an X axis direction of the crystal.

A first excitation electrode 15 is formed on an upper surface of the crystal substrate 14. A second excitation electrode 16 is formed on a lower surface of the crystal substrate 14.

A characteristic of the crystal vibration device 1 is that a distance A (mm), which is decided upon as described below, has a range of $A > 4.30t + 0.16$, where t (μm) represents the thickness of the crystal substrate 14. Consequently, ESR damping can be effectively suppressed. This point will be explained while referring to FIGS. 3 to 5.

Figure 3:
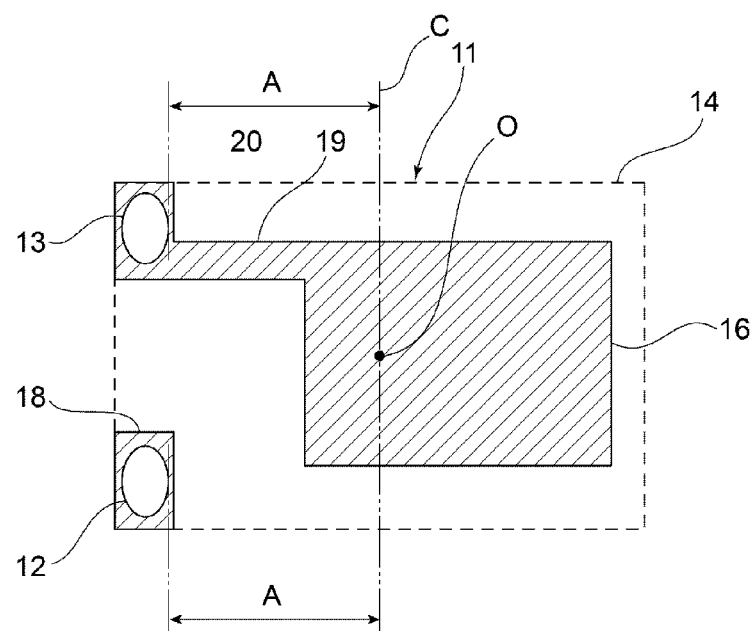
FIG. 3 is a schematic plan view for explaining a distance A in the crystal vibration device of the embodiment of the present invention.

FIG. 3 is a schematic plan view for explaining the distance A. Here, the crystal unit 11 is indicated by a broken line. The above-mentioned first and second conductive adhesive layers 12 and 13 are bonded to the lower surface of the crystal unit 11. The length direction of the crystal substrate 14 is the above-mentioned X axis direction. The distance between a central axis C, which passes through a center O of the crystal substrate 14 and extends in a width direction orthogonal to the length direction, and end portions of the conductive adhesive layers 12 and 13 on the central axis C side is represented by A (mm). The distance between the central-axis-side end portion of the first conductive adhesive layer 12 and the central axis C and the distance between the central-axis-side end portion of the second conductive adhesive layer 13 and the central axis C of the crystal substrate 14 are equal to each other in this embodiment. Of course, these distances would commonly be different from each other. In the case where the distances are different from each other, A may be the shorter distance.

As a result of diligently performing investigations on the crystal vibration device 1, the inventors of the present application found that ESR damping could be effectively suppressed by making the distance A be larger than a specific range. The present invention was based on this new finding of the inventors of the present application.

Figure 4:
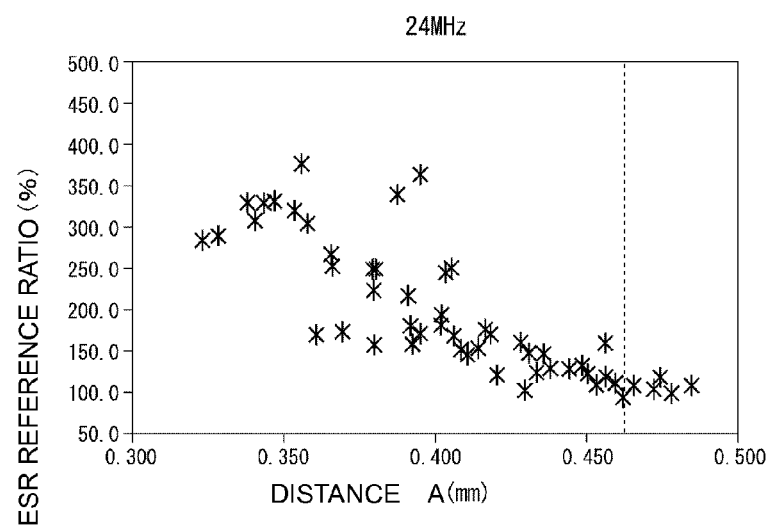
FIG. 4 illustrates the relationship between the distance A in a crystal vibration device with an oscillation frequency of a 24 MHz band and the equivalent series resistance (ESR).

FIG. 4 illustrates the change in ESR in a case where a crystal vibration device with an oscillation frequency of 24 MHz was manufactured and the distance A was changed to various values.

An ESR reference ratio (%) of the vertical axis represents a relative value when a minimum value of ESR is 100 (%). It is clear that ESR becomes smaller and the variation of ESR also becomes smaller as the distance A becomes larger. In other words, it is clear that ESR becomes small and the variation of ESR also becomes small when the distance A becomes larger than 0.461. In contrast, it is clear that the values of ESR vary and become larger when the distance A is equal to or less than 0.461. That is, it is clear that ESR damping can be suppressed in the crystal vibration device 1 having an oscillation frequency of 24 MHz by making the distance A larger than 0.461.

Figure 5:
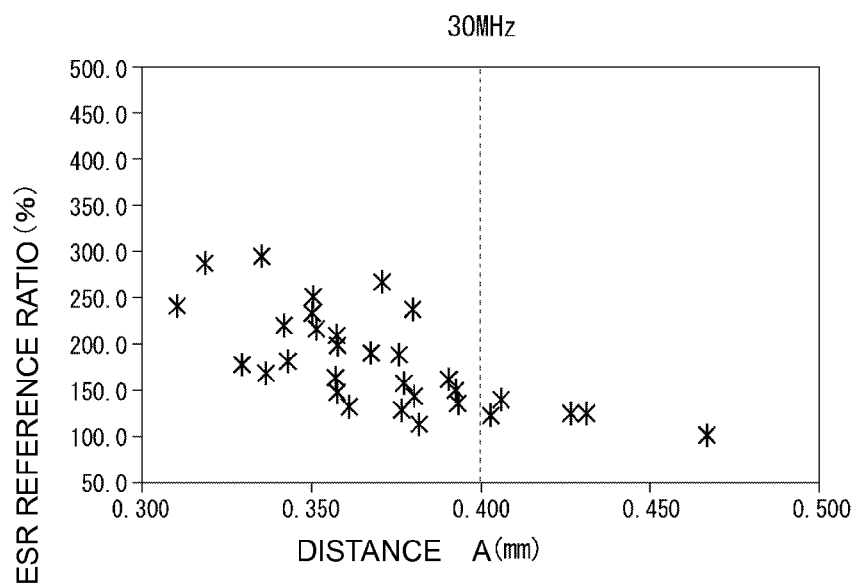
FIG. 5 illustrates the relationship between the distance A in a crystal vibration device with an oscillation frequency of a 30 MHz band and the equivalent series resistance (ESR).

FIG. 5 illustrates the ESR relationship for the case of the crystal vibration device 1 with an oscillation frequency of 30 MHz where the distance A was similarly changed to various values. An ESR reference ratio (%) of the vertical axis represents a relative value when a minimum value of ESR is 100 (%). As is clear from FIG. 5, it is sufficient that the distance A be larger than 0.3965.

Figure 6:
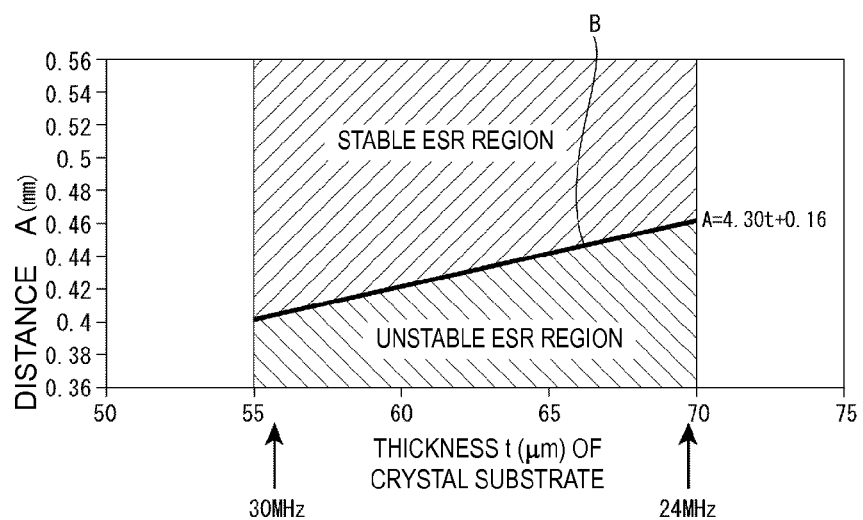
FIG. 6 illustrates the relationship between a thickness t of a crystal substrate and the distance A where ESR damping is suppressed.

In addition to the results illustrated in FIG. 4 and FIG. 5, the inventors of the present application also changed the oscillation frequency to various values and investigated the relationship between the distance A and ESR damping. The results are illustrated in FIG. 6. A straight line B in FIG. 6 is expressed by $A = 4.30t + 0.16$.

It was found that ESR damping could be effectively suppressed similarly to as in the stable regions of FIG. 4 and FIG. 5 when the distance A is larger than that of the straight line B. Therefore, in the present invention, a range of $A > 4.30t + 0.16$ is necessary.

The thickness t of the crystal substrate is determined by the oscillation frequency. In the case of a 24 MHz crystal unit, t=70 μm. On the other hand, in the case of a crystal unit with an oscillation frequency of 30 MHz, t=55 μm. Therefore, the thickness t of the crystal substrate is a value determined in accordance with the oscillation frequency of the crystal unit 11.

In addition, the frequency constant is 1670 MHz·μm for a crystal substrate composed of an AT cut crystal. The frequency constant of an AT cut crystal is assumed in the relationship of the expression $A > 4.30t + 0.16$ described above.

In the present invention, since the distance A is larger than $4.30t + 0.16$ as described above, ESR damping can be effectively suppressed.

The crystal substrate 14 is composed of an AT cut crystal substrate as described above and the length direction thereof is an X axis direction of the crystal. In this embodiment, the crystal unit 11 is supported at one end thereof in the length direction in a cantilever manner, that is, the crystal unit 11 is supported at a short edge side thereof. Consequently, the effect of restriction due to mechanical support is large. However, since the distance A has a specific range in the present invention, the effect of vibration restriction can be effectively suppressed. That is, ESR damping can be effectively suppressed.

As illustrated in FIG. 1, in the crystal vibration device 1, a cap 21 that is downwardly open is fixed to an upper surface of the case substrate 2 so as to enclose the crystal unit 11. The fixing can be performed using a suitable adhesive such an epoxy-resin-based adhesive. In addition, the cap 21 is composed of a metal and has a downwardly open shape. Therefore, since a package is formed using the cap 21 in the crystal vibration device 1, size reduction can be achieved.

The cap 21 may be formed of a material other than metal.

In addition, in the present invention, the crystal unit 11 may be sealed using another package material instead of the cap 21.

REFERENCE SIGNS LIST

1 . . . crystal vibration device
2 . . . case substrate
3 . . . first mounting electrode
4 . . . second mounting electrode
5 . . . wiring electrode
6 . . . first outer electrode
7 . . . wiring electrode
8 . . . second outer electrode
9 . . . dummy electrode
10 . . . dummy electrode
11 . . . crystal unit
12 . . . first conductive adhesive layer
13 . . . second conductive adhesive layer
14 . . . crystal substrate
15 . . . first excitation electrode
16 . . . second excitation electrode
21 . . . cap

The invention claimed is:

1. A crystal vibration device comprising:
a case substrate;
first and second mounting electrodes on a surface of the case substrate;
a crystal unit mounted on the case substrate, the crystal unit having a length direction and a width direction orthogonal to the length direction and comprising an AT cut rectangular-plate-shaped crystal substrate; and
first and second conductive adhesive layers electrically connecting the crystal unit to the first and second mounting electrodes, respectively, and supporting the crystal unit at one end thereof in the length direction in a cantilever manner;
wherein when A (mm) represents a shorter distance among a first distance between a central axis of the crystal substrate orthogonal to the length direction and extending in the width direction and an end portion of the first conductive adhesive layer on a central axis side and a second distance between the central axis of the crystal substrate orthogonal to the length direction and extending in the width direction and an end portion of the second conductive adhesive layer on the central axis side and t (μm) represents a thickness of the crystal substrate, $A > 4.30t + 0.16$.

2. The crystal vibration device according to claim 1, wherein the length direction of the crystal substrate is an X axis direction of a crystal.

3. The crystal vibration device according to claim 1, wherein the first and second conductive adhesive layers comprise an epoxy-resin-based adhesive including an epoxy resin and a conductive material dispersed in the epoxy resin.

4. The crystal vibration device according to claim 1, wherein the crystal unit includes a first excitation electrode on a first surface of the crystal substrate, a second excitation electrode on a second surface of the crystal substrate and superposed with the first excitation electrode, and first and second terminal electrodes electrically connected to the first and second excitation electrodes, respectively, and provided on the second surface of the crystal substrate.

5. The crystal vibration device according to claim 1, wherein A is larger than 0.461 mm.

6. The crystal vibration device according to claim 1, wherein A is larger than 0.3965 mm.

7. The crystal vibration device according to claim 1, further comprising a cap affixed to the surface of the case substrate so as to enclose the crystal unit.

* * * * *